US009842855B2

(12) United States Patent
Lee

(10) Patent No.: US 9,842,855 B2
(45) Date of Patent: Dec. 12, 2017

(54) MANUFACTURING METHOD OF MEMORY DEVICE

(71) Applicant: SK hynix Inc., Icheon-si Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/245,380

(22) Filed: Aug. 24, 2016

(65) Prior Publication Data

US 2017/0309636 A1    Oct. 26, 2017

(30) Foreign Application Priority Data

Apr. 20, 2016    (KR) ........................ 10-2016-0048188

(51) Int. Cl.
| | |
|---|---|
| H01L 21/311 | (2006.01) |
| H01L 27/11582 | (2017.01) |
| H01L 27/11573 | (2017.01) |
| H01L 23/522 | (2006.01) |
| H01L 29/792 | (2006.01) |
| H01L 29/66 | (2006.01) |

(52) U.S. Cl.
CPC .. *H01L 27/11582* (2013.01); *H01L 21/31116* (2013.01); *H01L 21/31144* (2013.01); *H01L 23/5226* (2013.01); *H01L 27/11573* (2013.01); *H01L 29/66666* (2013.01); *H01L 29/66833* (2013.01); *H01L 29/7926* (2013.01)

(58) Field of Classification Search
CPC ......... H01L 27/11582; H01L 27/11573; H01L 21/31116; H01L 21/31144; H01L 23/5226; H01L 29/6666; H01L 29/66833; H01L 29/7926
See application file for complete search history.

(56) References Cited

U.S. PATENT DOCUMENTS

| 9,257,496 | B2 * | 2/2016 | Chang ..................... H01L 28/40 |
| 9,337,093 | B2 * | 5/2016 | Oshida ............. H01L 21/76883 |
| 9,564,451 | B1 * | 2/2017 | Shin .................. H01L 27/11582 |
| 2014/0264682 | A1 * | 9/2014 | Chuang ................ H01L 21/768 257/431 |

FOREIGN PATENT DOCUMENTS

| KR | 1020130138532 A | 12/2013 |
| KR | 1020140025049 A | 3/2014 |

* cited by examiner

*Primary Examiner* — Savitr Mulpuri
(74) *Attorney, Agent, or Firm* — William Park & Associates Ltd.

(57) ABSTRACT

A method of manufacturing a memory device includes providing a semiconductor substrate including a first region and a second region. The method includes forming a lower structure including interconnect lines and an etch stop layer in the second region. The method includes forming a multilayer structure on the lower structure. The method also includes forming a slit trench in the multilayer structure of the first region, a first plug hole exposing the etch stop layer of the second region therethrough, and a second plug hole exposing a portion of the interconnect lines of the second region therethrough.

19 Claims, 19 Drawing Sheets

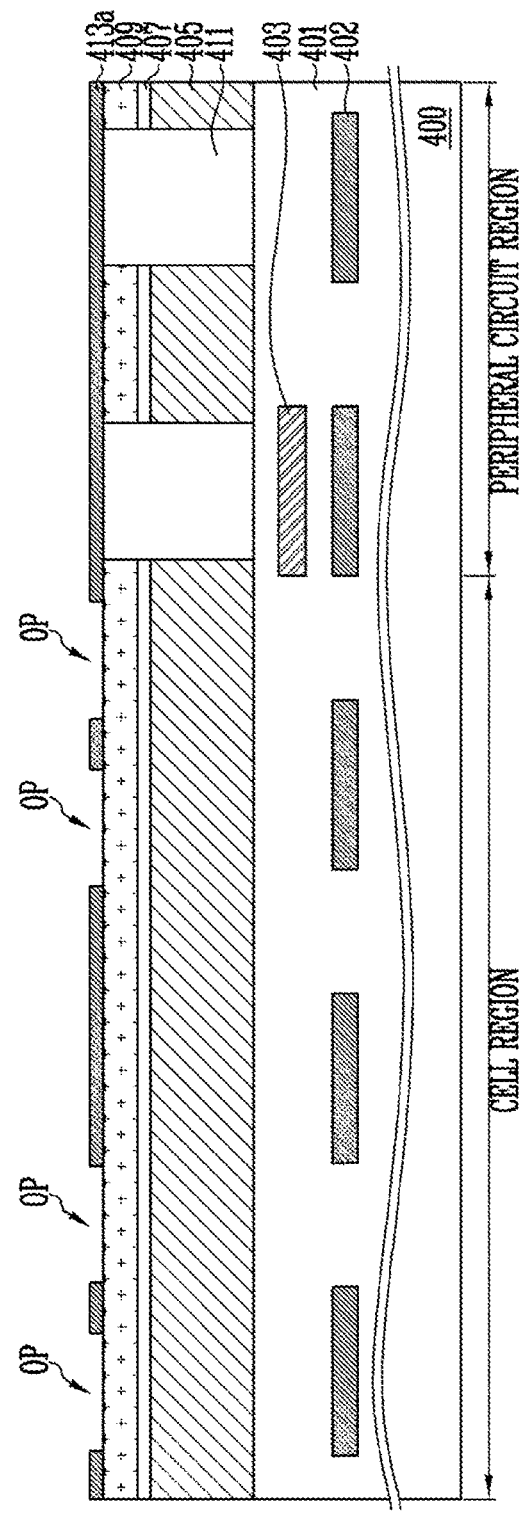

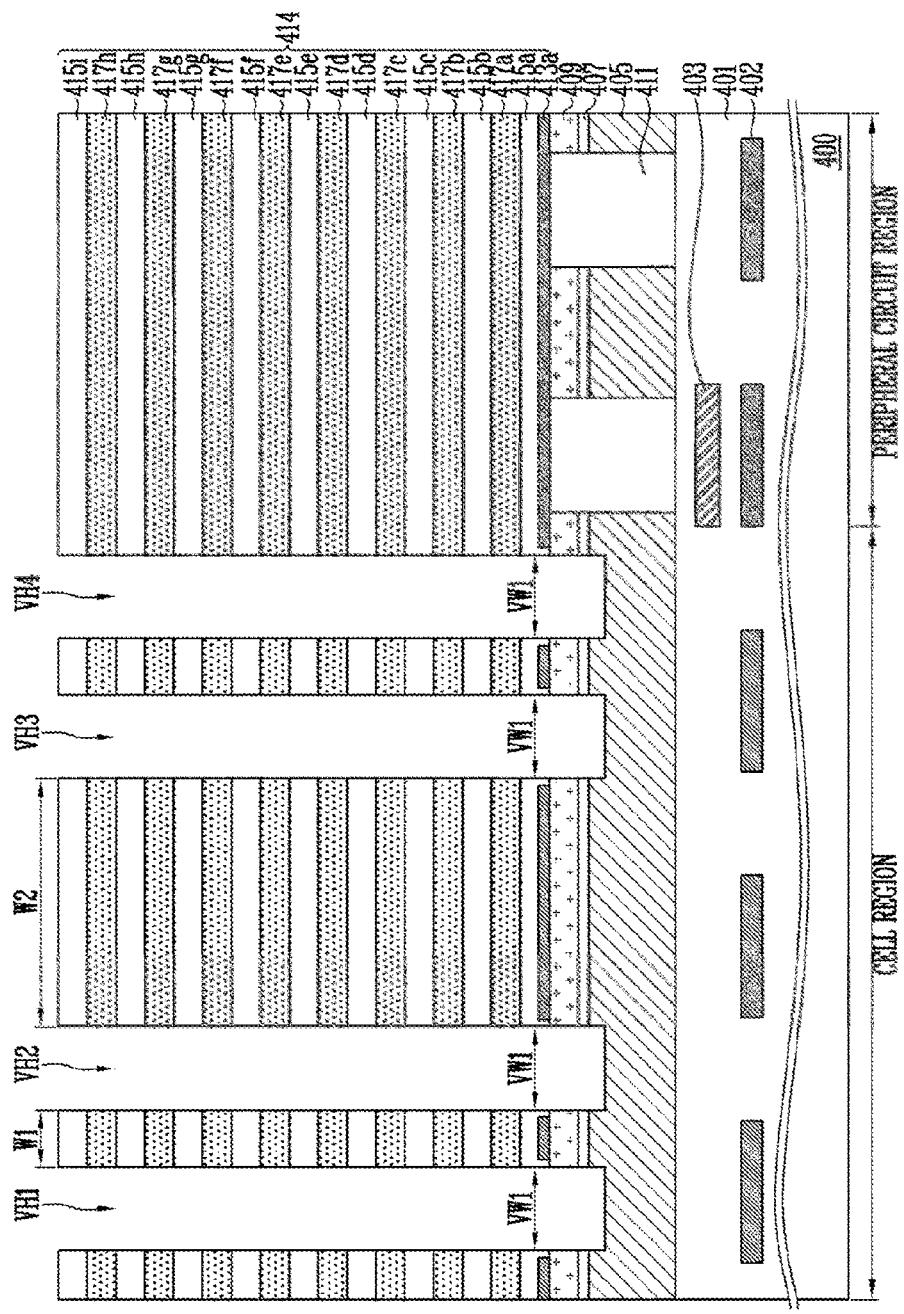

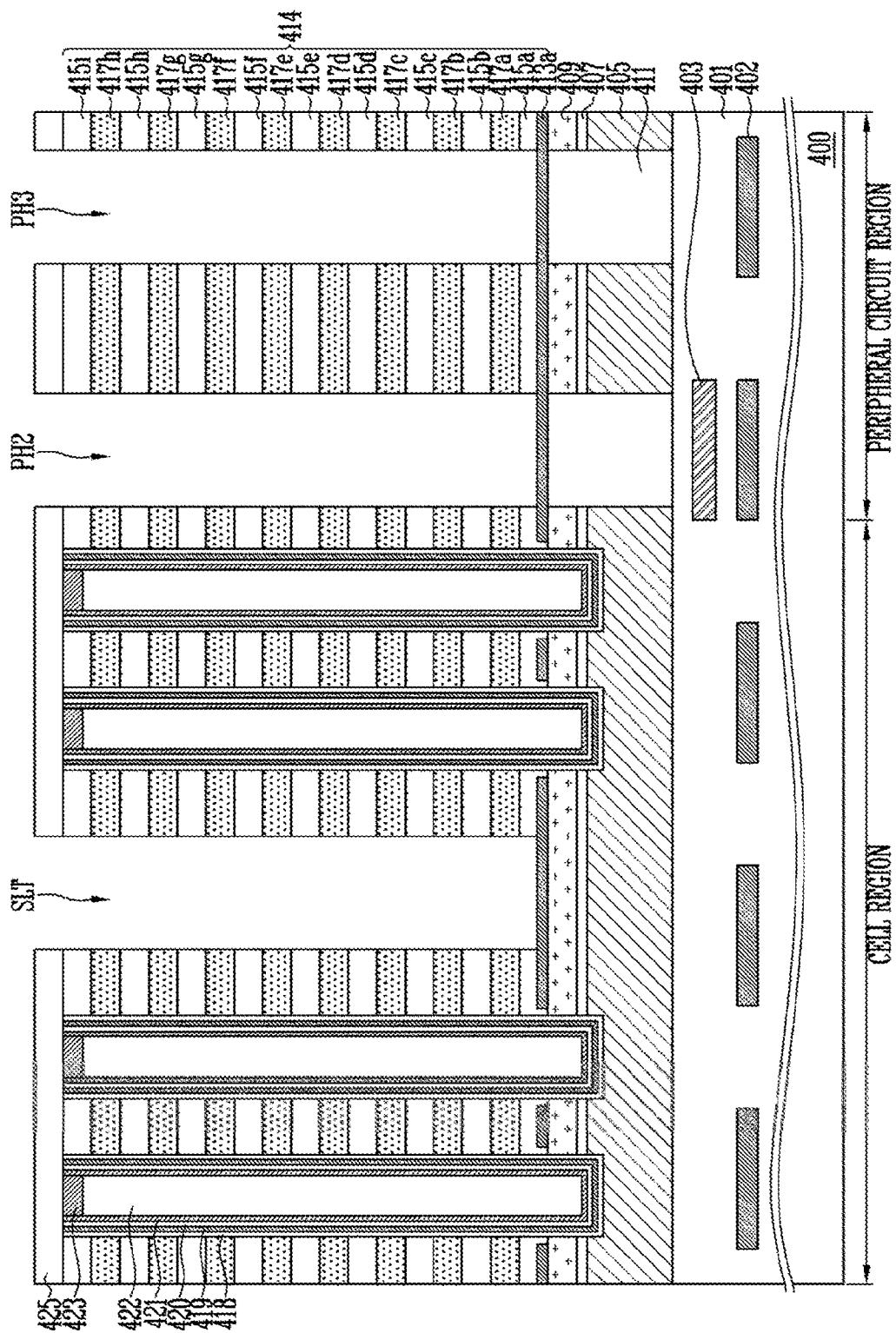

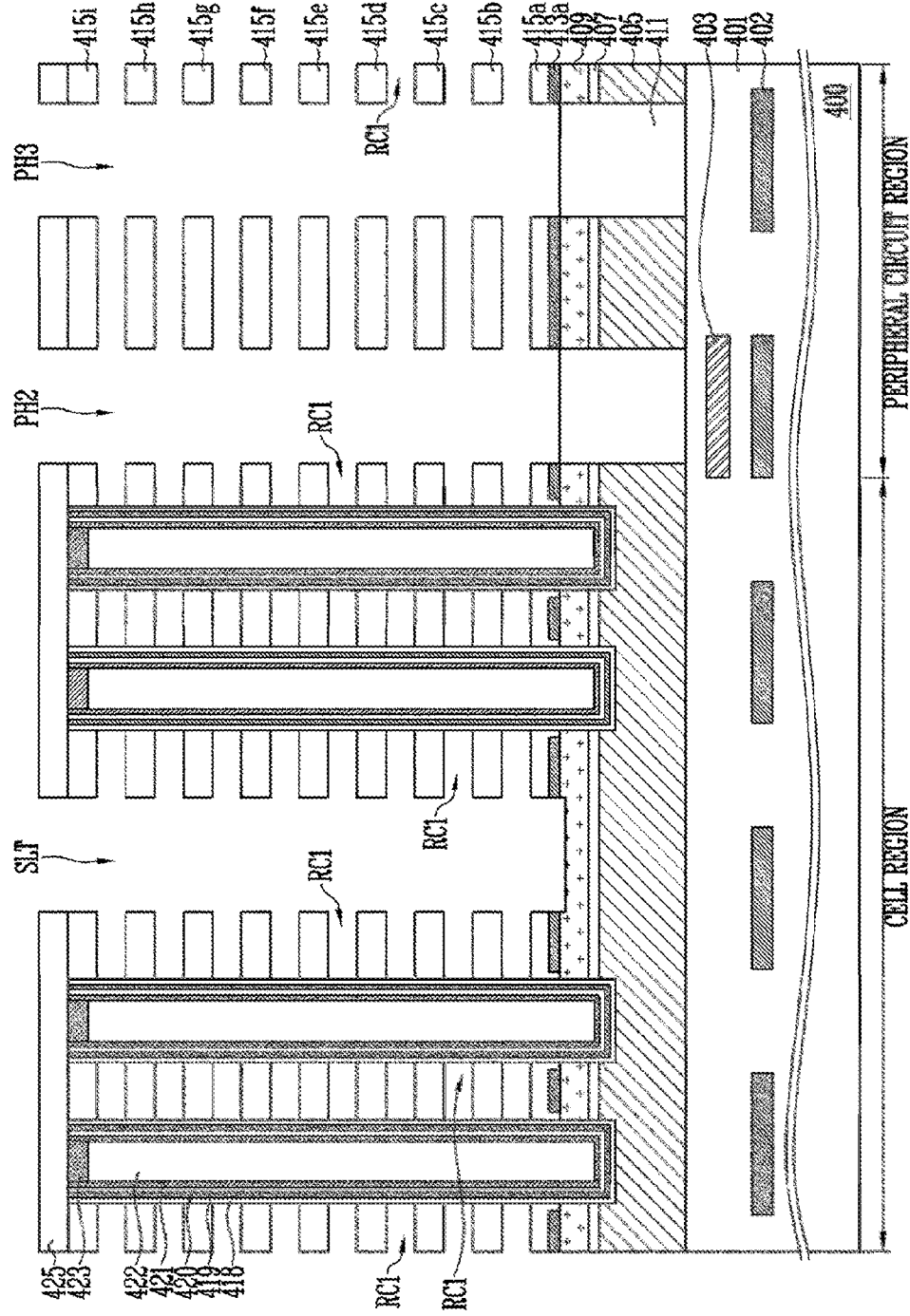

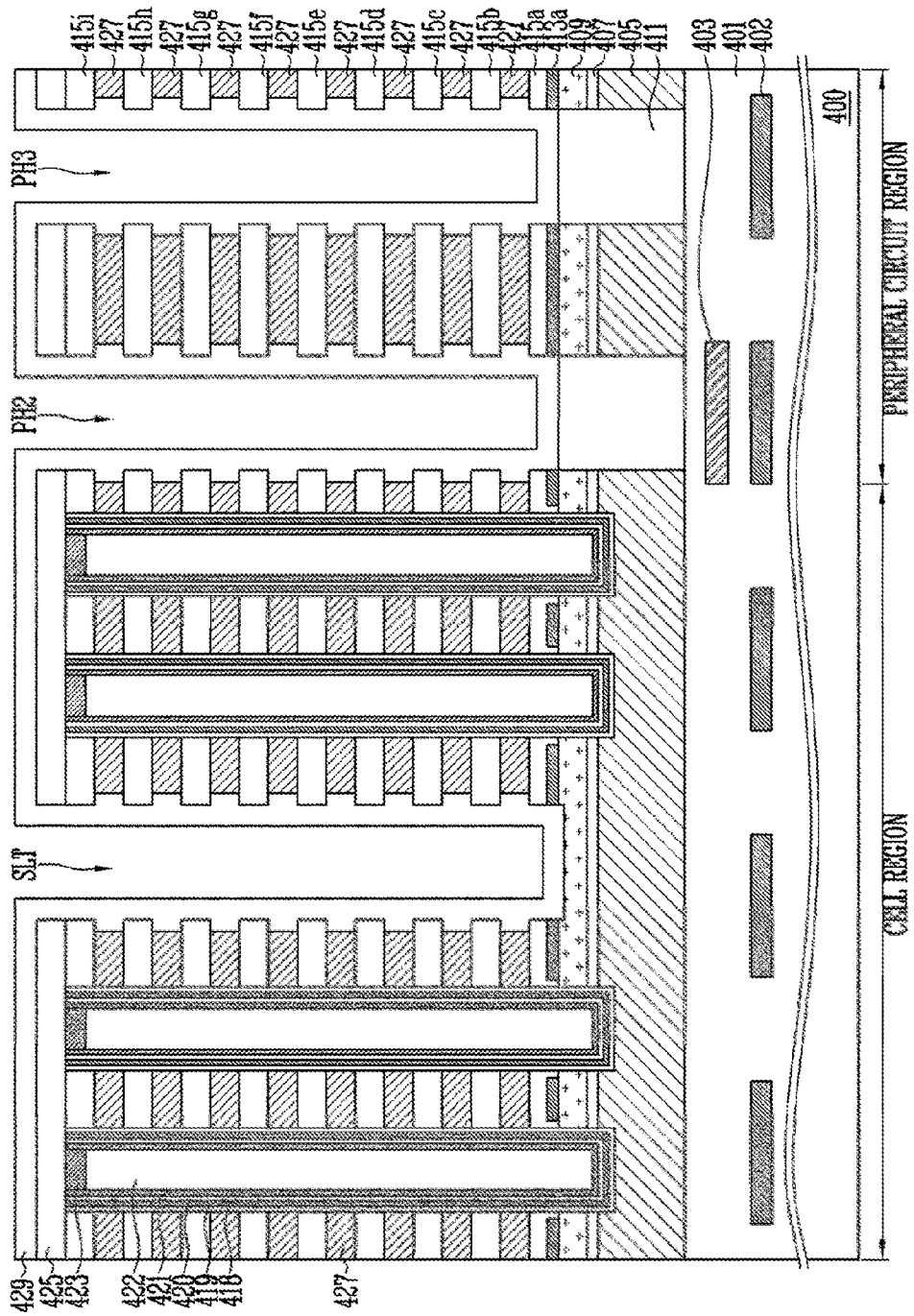

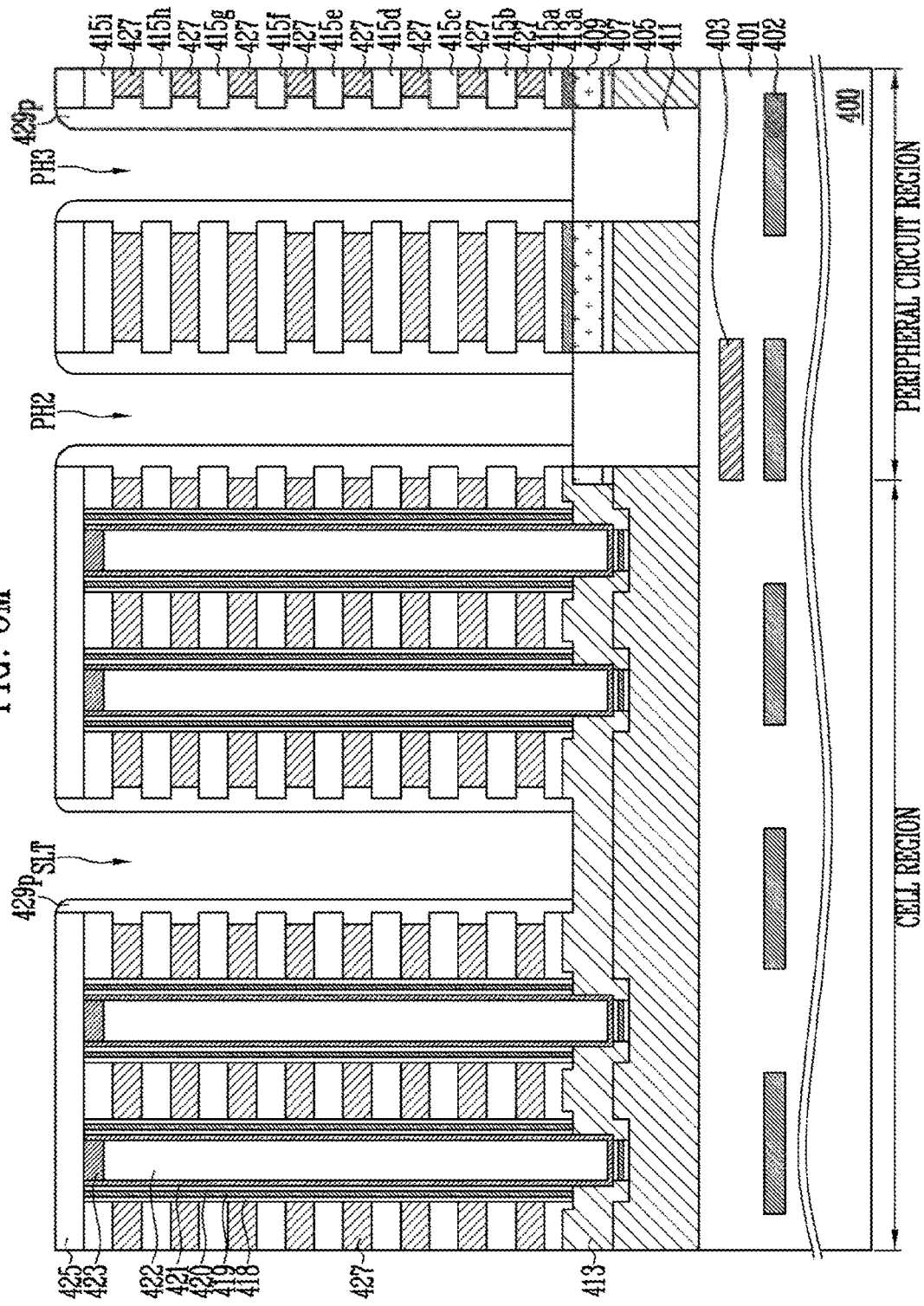

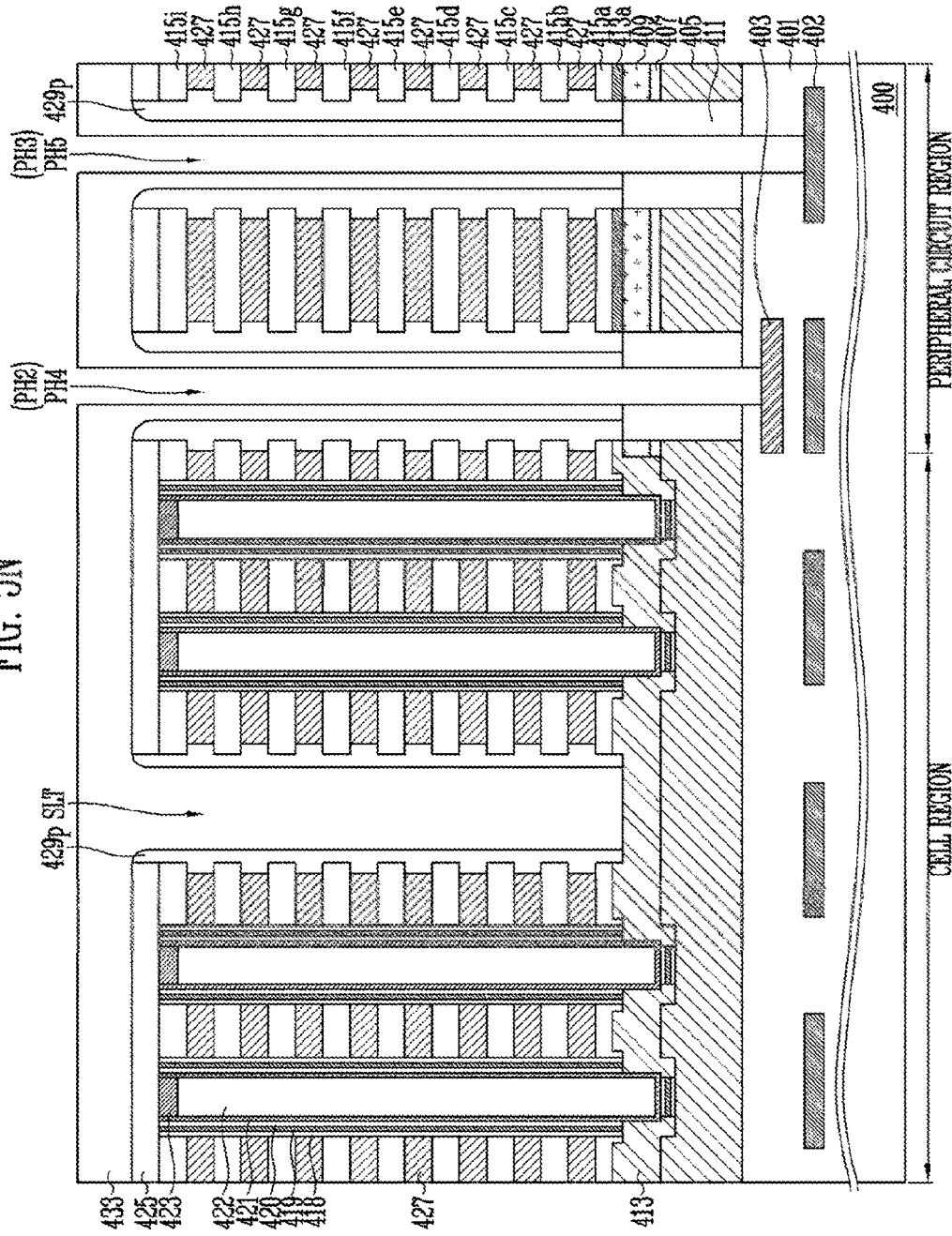

MANUFACTURING METHOD OF MEMORY DEVICE

CROSS-REFERENCE TO RELATED APPLICATION

The present application claims priority under 35 U.S.C. §119(a) to Korean patent application number 10-2016-0048188 filed on Apr. 20, 2016 in the Korean Intellectual Property Office, the entire disclosure of which is incorporated herein by reference.

BACKGROUND

1. Technical Field

An aspect of the present disclosure generally relates to a manufacturing method of a memory device, and more particularly to a manufacturing method of a three-dimensional memory device.

2. Related Art

A memory system may include a memory device for storing data and a memory controller for controlling the memory device.

Examples of the memory device may include a volatile memory device and a nonvolatile memory. The volatile memory is a memory device that only retains its data while it is powered. In contrast, the nonvolatile memory can retain its data even in the absence of a power source.

As portable electronic devices become more compact, the need for miniaturized, large-capacity storage devices increases. In recent years, nonvolatile semiconductor memory devices are increasingly used as the data storage devices.

Among various nonvolatile semiconductor memory devices, flash memory devices are frequently used in the portable electronic devices.

A flash memory device may include a memory cell array for storing data, peripheral circuits for performing program, read, and erase operations, and a control logic for controlling the peripheral circuits.

For example, in NAND flash memory devices, memory cells of the memory cell array may be grouped into a plurality of memory blocks, and each of the memory blocks may include a plurality of memory cell strings. Memory devices may be classified into two-dimensional and three-dimensional memory devices depending on structures of the memory cell strings.

A two-dimensional memory device may include memory cell strings horizontally arranged over a substrate, and a three-dimensional memory device may include memory cell strings vertically arranged from a substrate.

SUMMARY

According to an aspect of the present disclosure, there is provided a method of manufacturing a memory device. The method may include providing a semiconductor substrate including a first region and a second region. The method may include forming a lower structure including interconnect lines and an etch stop layer in the second region. The method may include forming a multilayer structure on the lower structure. The method may include forming a slit trench in the multilayer structure of the first region, a first plug hole exposing the etch stop layer of the second region therethrough, and a second plug hole exposing a portion of the interconnect lines of the second region therethrough.

According to an aspect of the present disclosure, there is provided a method of manufacturing a memory device. The method may include forming a lower structure including interconnect lines and a first etch stop layer on a semiconductor substrate including a cell region and a peripheral circuit region. The method may include sequentially forming a first conductive layer, a second etch stop layer, and a second conductive layer on the lower structure. The method may include forming, in the peripheral circuit region, a first insulating layers vertically penetrating the second conductive layer, the second etch stop layer, and the first conductive layer. The method may include forming, in the cell region, an etch stop pattern including openings on the second conductive layer and the first insulating layers. The method may include forming a multilayer structure on the entire structure including the etch stop pattern. The method may include forming vertical holes vertically penetrating the multilayer structure of the cell region, and forming memory layers and channel layers inside the vertical holes. The method may include forming a slit trench vertically penetrating the multilayer structure of the cell region and plug holes vertically penetrating the multilayer structure of the peripheral circuit region. The method may include etching the lower structure exposed through bottom surfaces of the plug holes such that the first etch stop layer and a portion of the interconnect lines are exposed in the peripheral circuit region.

DETAILED DESCRIPTION

Figure 1:
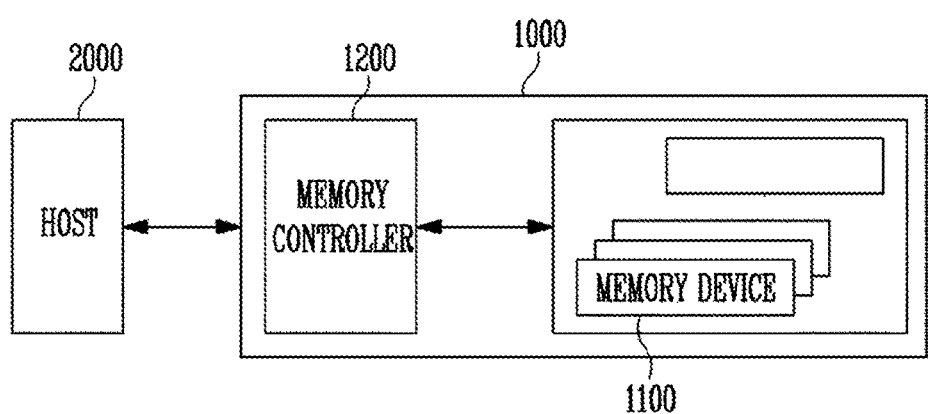
FIG. 1 is a diagram illustrating an example of a memory system according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art.

FIG. 1 is a diagram illustrating an example of a memory system according to an embodiment of the present disclosure.

Referring to FIG. 1, the memory system 1000 may include memory devices 1100 for storing data and a memory controller 1200 for controlling the memory devices 1100.

A plurality of memory devices 1100 may be included in the memory system 1000. For example, the memory devices 1100 may be NAND flash memory devices.

The memory controller 1200 may control the general operations of the memory device 1100. In response to a command received from an external device such as a host 2000, the memory controller 1200 may output, to the memory device 1100, a command for controlling the memory device 1100, an address, and data. The memory controller 1200 may also output data received from the memory device 1100 to a host 2000 in response to the command.

The host 2000 may communicate with the memory system 1000 by using an interface protocol such as peripheral component interconnect-express (PCI-E), advanced technology attachment (ATA), serial ATA (SATA), parallel ATA (PATA), or serial attached SCSI (SAS).

Figure 2:
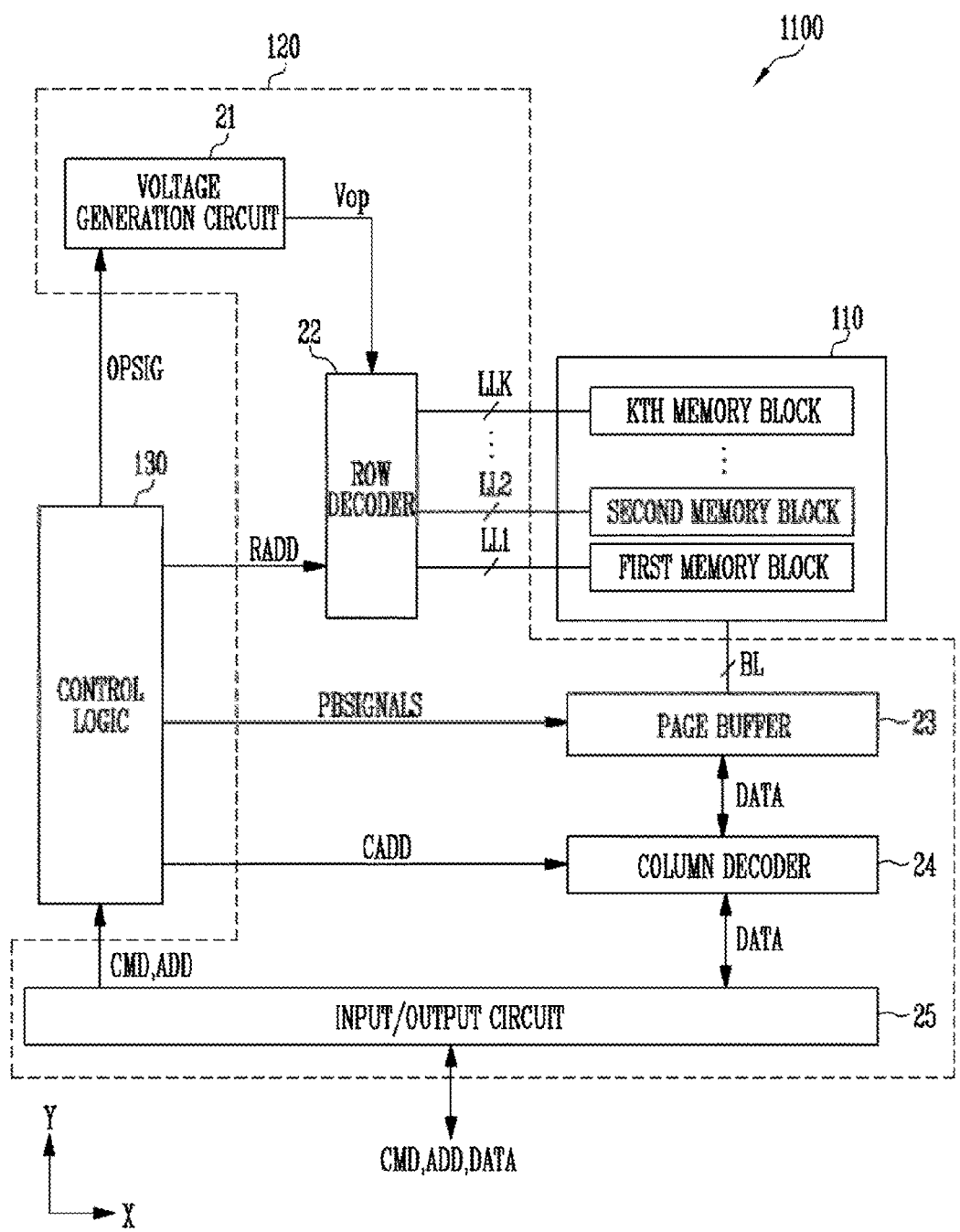
FIG. 2 is a diagram illustrating an example of a memory device of FIG. 1.

FIG. 2 is a diagram illustrating an example of a memory device of FIG. 1.

Referring to FIG. 2, the memory device 1110 may include a memory cell array 110 for storing data, a peripheral circuit 120 for performing a program, read, and erase operation of the memory cell array 110, and a control circuit 130 for controlling the peripheral circuit 120.

Memory cells of the semiconductor memory device 1100 may be arranged in the memory cell array 110. The memory cells of the memory cell array 110 may be grouped into first to $K^{th}$ memory blocks (K is a positive integer). The first to $K^{th}$ memory blocks may be coupled to first to Kth local lines LL1 to LLK, respectively. The first to $K^{th}$ memory blocks may be formed in a three-dimensional structure. The first to $K^{th}$ memory blocks may be configured identically to each other.

The peripheral circuit 120 may include a voltage generation circuit 21, a row decoder 22, a page buffer 23, a column decoder 24, and an input/output circuit 25.

The voltage generation circuit 21 may generate operating voltages Vop having various levels in response to an operation signal OPSIG, and may selectively apply the generated operation voltages Vop to global lines. In response to an operation signal OPSIG corresponding to a program, read, or erase operation, the voltage generation circuit 21 may generate operating voltages Vop having various levels required to perform the program, read, or erase operation.

The row decoder 22 may apply the operating voltage Vop to local lines coupled to a selected memory block, among the first to Kth local lines LL1 to LLK, in response to a row address RADD. For example, the row decoder 22 may be coupled to the voltage generation circuit 21 through the global lines. The row decoder 22 may apply the operating voltages Vop received through the global lines to the local lines coupled to the selected memory block.

The page buffer 23 is coupled to the memory cell array 110 through bit lines BL. In response to a page buffer control signal PBSIGNALS, the page buffer 23 may precharge the bit lines BL with a positive voltage, and transmit/receive data to/from the selected memory block in the program and read operations. The page buffer 23 may temporarily stores the transmitted data in response to a page buffer control signal PBSIGNALS.

The column decoder 24 may be used to select a column (e.g., a page buffer coupled to a column). The column decoder 24 may also be used to exchange data between the page buffer 23 and the input/output circuit 25. For example, between the page buffer 23 and the input/output circuit 25, data DATA may be transferred through the column decoder 24 in response to a column address CADD.

The input/output circuit 25 may transmit, to the control logic 130, a command CMD and an address ADD, which are transmitted from the memory controller 1200. The input/output circuit 25 may also transmit data DATA to the column decoder 24, and output data DATA transmitted from the column decoder 24 to the memory controller 1200.

The control logic 130 may control the peripheral circuit 120 in response to the command CMD and the address ADD. For example, the control logic 130 may output the operation signal OPSIG, the row address RADD, the page buffer control signal PBSIGNALS, and the column address CADD to control the peripheral circuit 120 in response to the command CMD and the address ADD.

In an embodiment, the memory cells of the semiconductor memory device 1100, which are grouped into the first to $K^{th}$ memory blocks, may be arranged in a three-dimensional structure. Hereinafter, one of the first to Kth memory blocks will be described as an example.

Figure 3:
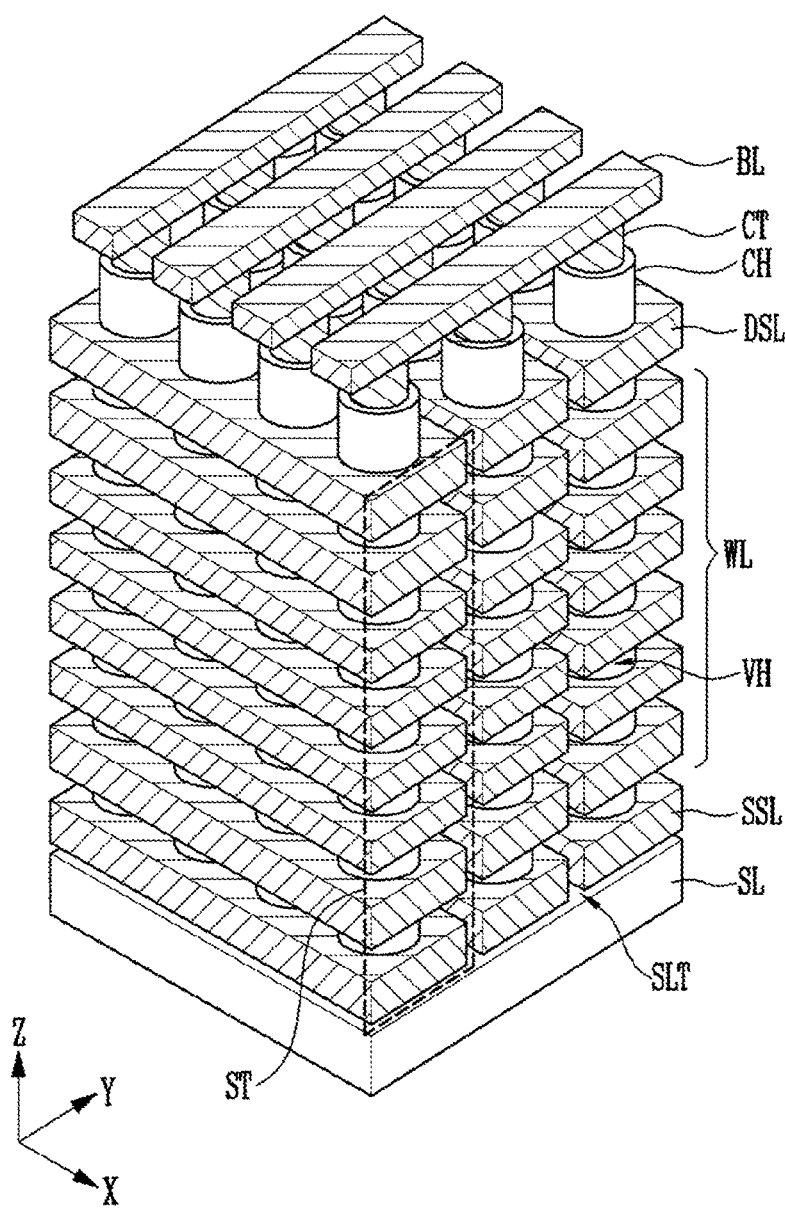
FIG. 3 is a perspective view illustrating an example of a memory block having a three-dimensional structure according to an embodiment of the present disclosure.

FIG. 3 is a perspective view illustrating an example of a memory block having a three-dimensional structure according to an embodiment of the present disclosure.

Referring to FIG. 3, the memory block having the three-dimensional structure may include a plurality of memory cell strings ST arranged vertically (e.g., in a Z direction) on a substrate. The memory cell strings ST may be formed vertically between bit lines BL and a source line SL. For example, when the source line SL is horizontally formed over the substrate, the vertical memory cell strings may be formed in the vertical direction (e.g., Z direction) over the source line SL. More specifically, the vertical memory cell strings may include source select lines SSL, word lines WL, and drain select lines DSL, which are stacked to be spaced apart from each other. Although not illustrated, the vertical memory cell strings may further include dummy select lines or dummy word lines.

In an intermediate structure or in a final structure, the vertical memory cell strings may include vertical holes VH vertically penetrating the source select lines SSL, the word lines WL, and the drain select lines DSL. The vertical memory cell strings may include vertical channel layers CH formed inside the respective vertical holes VH to come in contact with the source line SL. Source select transistors may be formed between the vertical channel layers CH and the source select lines SSL. Memory cells may be formed between the vertical channel layers CH and the word lines WL. Drain select transistors may be formed between the vertical channel layers CH and the drain select lines DSL.

The bit lines BL may be in contact with the top ends of the vertical channel layers CH extending upwardly from the source line SL from the drain select lines DSL. The bit lines BL may extend along a Y direction, and may be spaced apart from each other along an X direction perpendicular to the Y direction. The source select lines SSL, the word lines WL, and the drain select lines DSL may be arranged along the X direction, and may be spaced part from each other along the Y direction. Contact plugs CT may be further formed between the bit lines BL and the vertical channel layers CH.

In addition, a slit trench SLT vertically separating the drain select lines DSL, the word lines WL, and the source select lines SSL may be formed between some adjacent memory cell strings ST.

Figure 4:
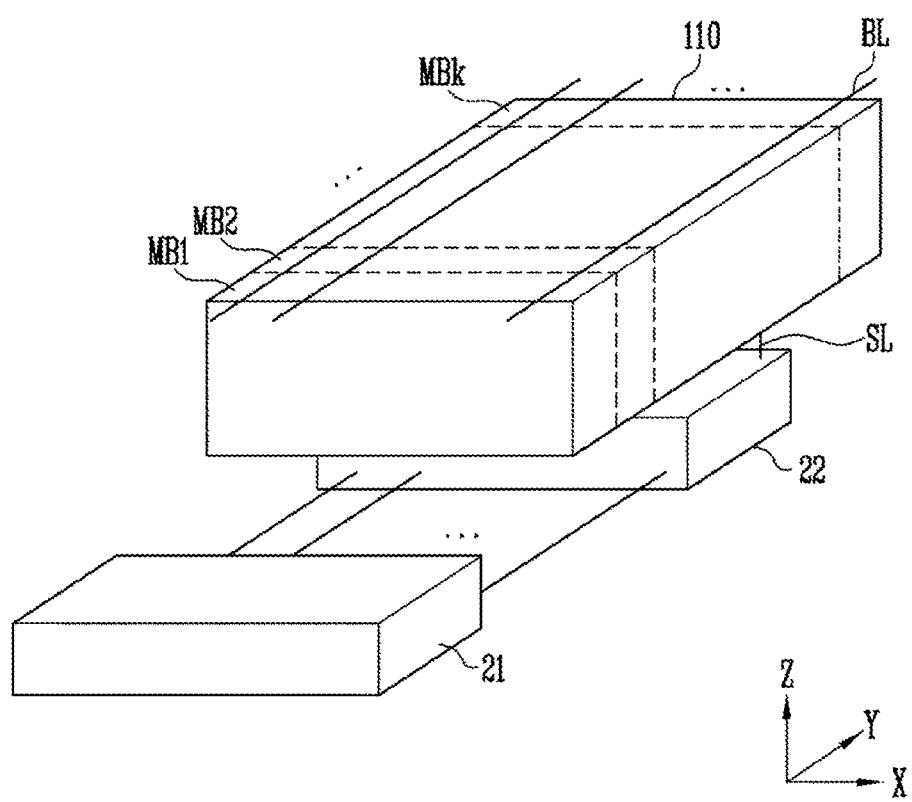
FIG. 4 is a perspective view illustrating an example configuration of a memory cell array and a peripheral circuit in FIG. 2.

FIG. 4 is a perspective view illustrating an example configuration of the memory cell array and the peripheral circuit in FIG. 2.

Referring to FIG. 4, in order to decrease the size of the memory device, the peripheral circuit 120 of FIG. 2 may be located under the memory cell array 110. In FIG. 4, the voltage generation circuit 21 and the row decoder 22, which are included in the peripheral circuit 120, are illustrated.

The memory cell array 110 may include a plurality of memory blocks MB1 to MBk (k is a positive integer). The memory blocks MB1 to MBk may share a plurality of bit lines BL and a source line SL with one another. When the memory cell array 110 is formed into a three-dimensional structure, the bit lines BL may be arranged over the memory cell array 110, and the source line SL may be disposed under the memory cell array 110. A voltage applied to the source line SL may be generated by the voltage generation circuit 21. A source voltage generated by the voltage generation circuit 21 may be directly applied to the source line SL, or may be applied to the source line SL through the row decoder 22.

Figure 5A:
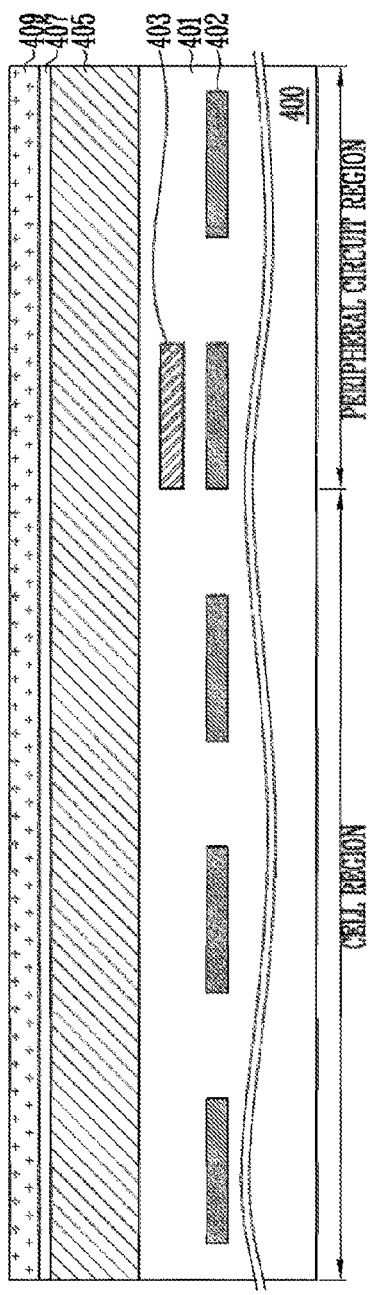
FIGS. 5A to 5O are cross-sectional views illustrating an example manufacturing method of a memory device according to an embodiment of the present disclosure.

FIGS. 5A to 5O are cross-sectional views illustrating an example manufacturing method of a memory device according to an embodiment of the present disclosure.

Referring to FIG. 5A, a lower structure including a peripheral circuit (not illustrated) and a first insulating layer 401 may be formed on a semiconductor substrate 400. The lower structure may divide the semiconductor substrate 400 into a cell region and a peripheral circuit region. In the lower structure, interconnect lines 402 and a first etch stop layer 403 may be arranged in the first insulating layer 401. In an embodiment, some peripheral circuits (not illustrated) may be formed between the semiconductor substrate 400 and the interconnect lines 402. The first insulating layer 401 may be formed of an oxide material. The lower structure may be formed in various ways. For example, after a lower portion of the first insulating layer 40 is formed, the interconnect lines 402 may be formed on the lower portion of the first insulating layer 401, and an upper portion of the first insulating layer 401 may be formed to insulate the interconnect lines 402 from each other. Then, the first etch stop layer 403 may be formed on the upper portion of the first insulating layer 401. Although not illustrated, the interconnect lines 402 may be electrically connected to the peripheral circuit (not illustrated), and may be electrically isolated from the first etch stop layer 403. The first etch stop layer 403 may be formed in the shape of a line or pad. The first etch stop layer 403 may be formed over the interconnect lines 402.

The interconnect lines 402 may be conductor lines for electrically connecting a portion of the peripheral circuit (not illustrated) to a memory cell array to be formed in a subsequent process or circuits over the memory cell array. The interconnect lines 402 may be formed of a conductive material or a metal.

The first etch stop layer 403 may be formed to limit the depth of some plug holes in a subsequent etching process for forming plug holes. The first etch stop layer 403 may be formed of a polysilicon material.

A first conductive layer 405 for a source line may be formed on the first insulating layer 401. The first conductive layer 405 may be formed of tungsten silicon (WSi) or a material containing the WSi. A second etch stop layer 407 and a first sacrificial layer 409 may be sequentially stacked over the first conductive layer 405. The second etch stop layer 407 may be formed of a material having a different etch rate from the first sacrificial layer 409. For example, the second etch stop layer 407 may be formed of an oxide material, and the first sacrificial layer 409 may be formed of a polysilicon material.

Figure 5B:
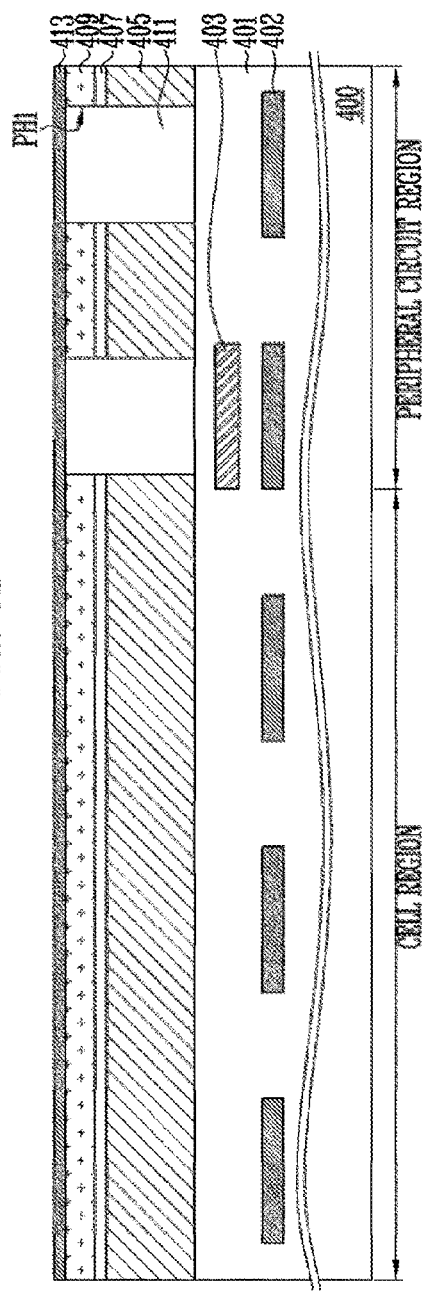

Referring to FIG. 5B, after first plug holes PH1 are formed in the peripheral circuit region, a second insulating layer 411 may be formed in the first plug holes PH1. For example, the first plug holes PH1 may be formed in the peripheral circuit region by etching portions of the first sacrificial layer 409, the second etch stop layer 407, and the first conductive layer 405. The width of the first plug holes PH1 may be formed equal to or narrower than that of the first etch stop layer 403 or the interconnect lines 402. The second insulating layer 411 may be formed of an oxide material.

After the second insulating layer 411 is formed inside the first plug holes PH1, a third etch stop layer 413 may be formed over the second insulating layer 411 and the first sacrificial layer 409. The third etch stop layer 413 may be formed of an Al$_2$O$_3$ material.

Referring to FIG. 5C, a portion of the third etch stop layer 413 is removed, thereby forming an etch stop pattern 413a including openings OP each exposing a portion of the first sacrificial layer 409 therethrough. In the cell region, the openings OP may be formed where the memory cell strings are to be formed. The width of each opening OP may be equal to or wider than that of the memory cell string.

Figure 5D:
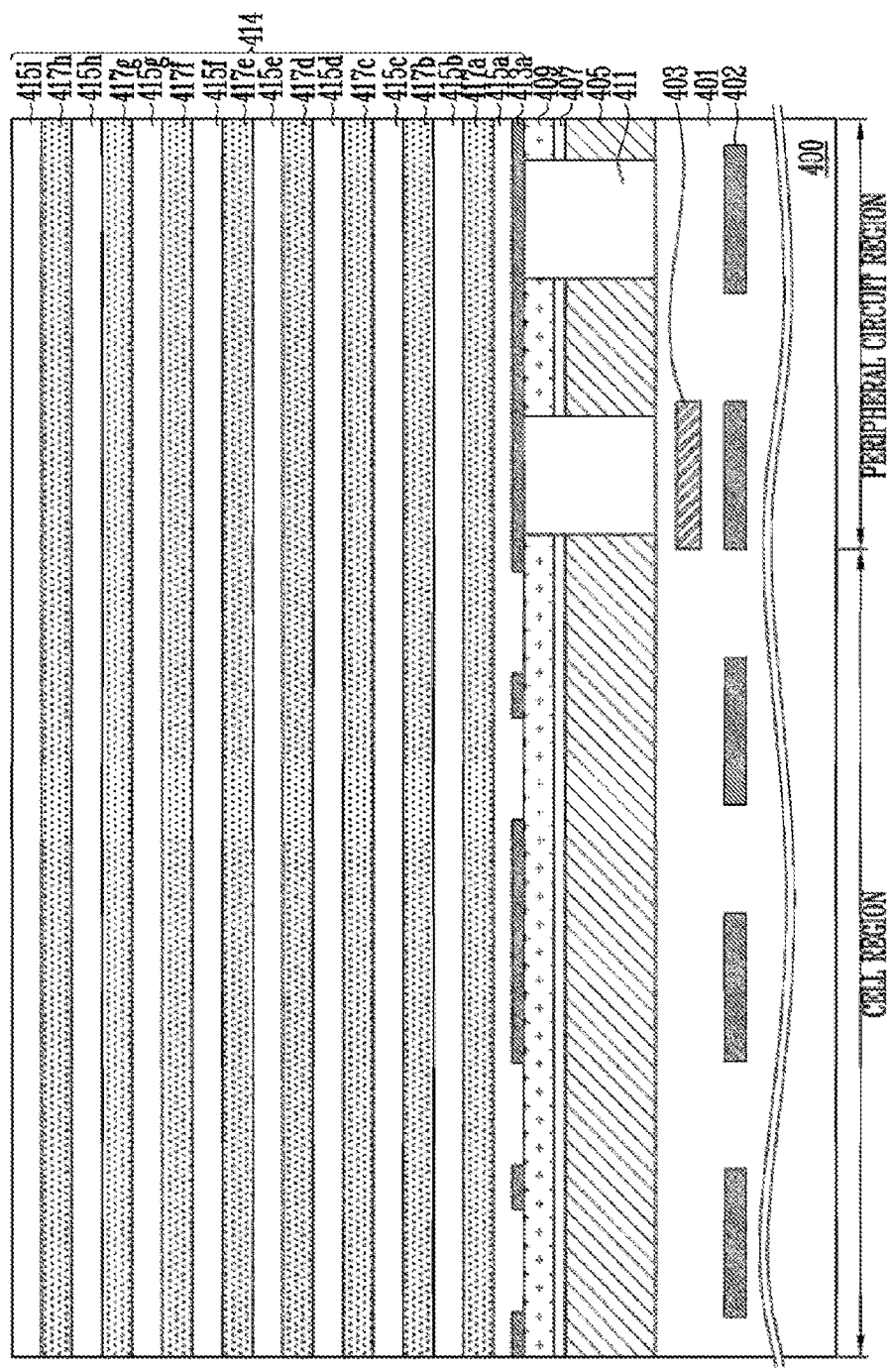

Referring to FIG. 5D, a multilayer structure 414 may be formed over the etch stop pattern 413a and the first sacrificial layer 409 exposed through the openings OP. The multilayer structure 414 may include first interlayer insulating layers 415a to 415i and second sacrificial layers 417a to 417h, which are alternately stacked. For example, the first interlayer insulating layers 415a to 415i may be formed of an oxide material, and the second sacrificial layers 417a to 417h may be formed of a nitride material. The numbers of the stacked first interlayer insulating layers 415a to 415i and second sacrificial layers 417a to 417h is not limited the numbers illustrated in FIG. 5D.

Referring to FIG. 5E, first to fourth vertical holes VH1 to VH4 may be formed where the memory cell strings are to be formed in the multilayer structure 414 of the cell region. Although FIG. 5E illustrates a part of the cell region and a part of the peripheral circuit region, the present disclosure is not limited thereto, and therefore more vertical holes may be formed in addition to the first to fourth vertical holes VH1 to VH4. The number of the openings discussed above (OP of FIG. 5C) may be identical to the number of vertical holes.

The first to fourth vertical holes VH1 to VH4 may be formed in the multilayer structure 414 by performing a dry etching process. For example, portions (e.g., string regions) of the first interlayer insulating layers 415a to 415i, the second sacrificial layers 417a to 417h, the first sacrificial layer 409, and the second etch stop layer 407 may be etched in a vertical direction, thereby forming the first to fourth vertical holes VH1 to VH4 vertically penetrating the first interlayer insulating layers 415a to 415i, the second sacrificial layers 417a to 417h, the first sacrificial layer 409, and the second etch stop layer 407. The first to fourth vertical holes VH1 to VH4 may be formed to an extent that the first conductive layer 405 is exposed through bottom surfaces thereof. If the width of the first to fourth vertical holes VH1 to VH4 is a first width VW1, the etch stop pattern 413a is not exposed in an etching process for forming the first to fourth vertical holes VH1 to VH4 because the width of each opening OP is equal to or wider than the first width VW1. Each of the distance between first and second vertical holes VH1 and VH2 and the distance between the third and fourth vertical holes VH3 and VH4 may be a first distance W1. The distance between the second and third vertical holes VH2 and VH3 may be set to a second distance W2 wider than the first distance W1 by considering the width of a slit trench to be formed in a slit region in a subsequent process.

Figure 5F:
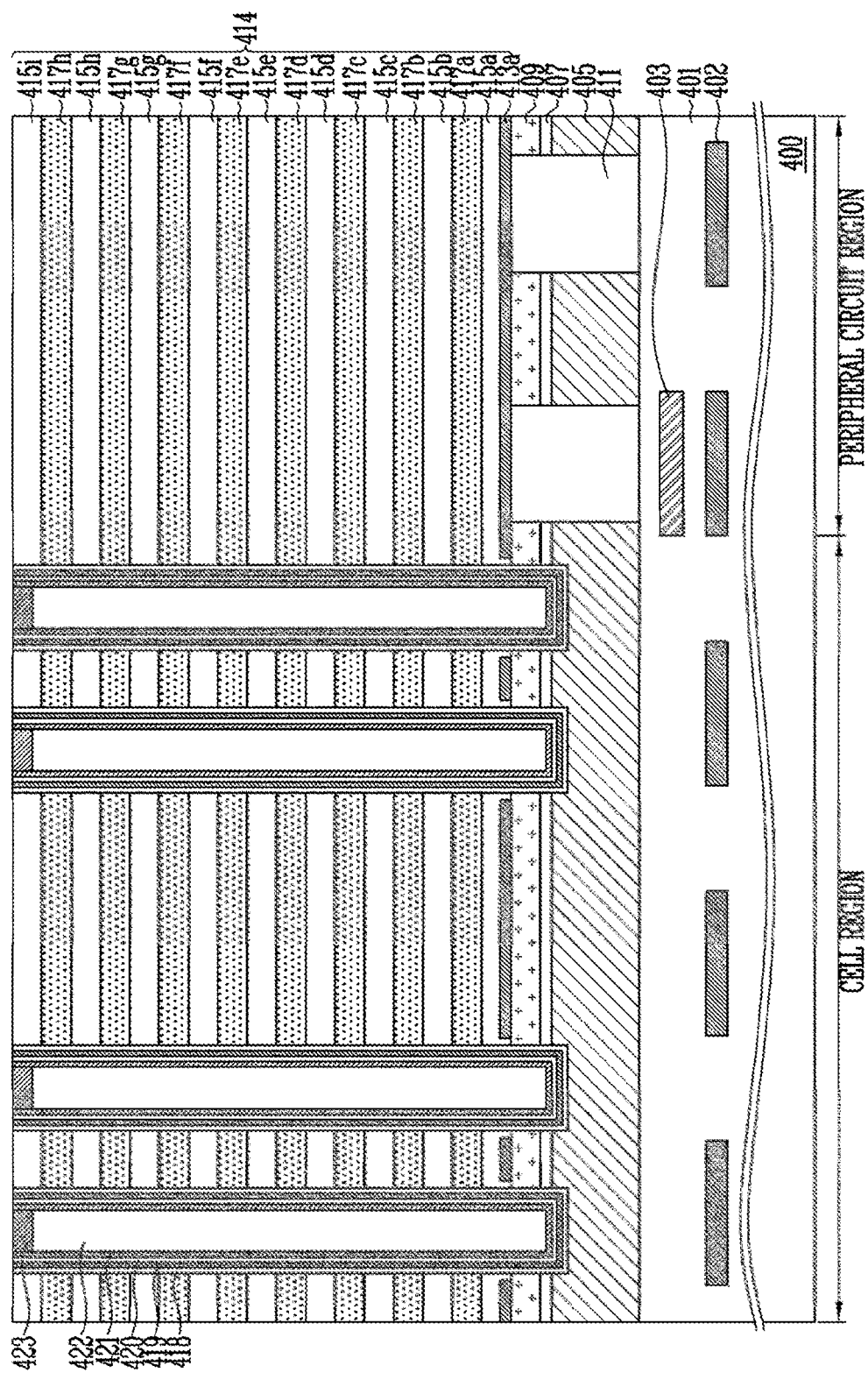

Referring to FIG. 5F, memory layers 418, 419, and 420 may be formed along inner surfaces of the first to fourth vertical holes VH1 to VH4. The memory layers 418, 419, and 420 may include a blocking layer 418, a trapping layer 419, and a tunnel insulating layer 420. The blocking layer 418 may be formed of an oxide material. The trapping layer is a layer that traps electrons, and may be formed of a nitride material. The tunnel insulating layer 420 may be formed of an oxide material. A channel layer 421 may be formed inside the first to fourth vertical holes VH1 to VH4 in which the tunnel insulating layer 420 is formed. The channel layer 421 may be formed of a polysilicon material. The channel layer 421 may be formed such that the insides of the first to fourth vertical holes VH1 to VH4 are filled with channel layer 421. Alternatively, the channel layer 421 may be formed along the surface of the tunnel insulating layer 420 such that the insides of the first to fourth vertical holes VH1 to VH4 are not filled with channel layer 421, and this example will be described below.

A vertical insulating layer 422 may be formed in the first to fourth vertical holes VH1 to VH4 in which the channel layer 421 is formed. The first to fourth vertical holes VH1 to VH4 may be filled with the vertical insulating layer 422 to an extent that upper regions of the first to fourth vertical holes VH1 to VH4 partially remain empty. Subsequently, a capping layer 423 may be formed in the empty portions of the upper regions of the first to fourth vertical holes VH1 to VH4. The vertical insulating layer 422 may be formed of a flowable material so that the first to fourth vertical holes VH1 to VH4 can be filled with the vertical insulating layer 422. For example, the vertical insulating layer 422 may be formed of polysilazane (PSZ). The capping layer 423 may be formed of the same material as the channel layer 421. For example, the channel layer 421 may be formed of a polysilicon material.

Referring to FIG. 5G, a hard mask pattern 425 may be formed over the multilayer structure 414. The hard mask pattern 425 may include a plurality of openings. The openings of the cell region may be formed in a slit region, and the openings of the peripheral circuit region may be formed in a contact plug region. Therefore, the widths of the openings included in the hard mask pattern 425 may be set by considering the widths of a slit trench SLT and contact plugs, which are to be formed in a subsequent process. Subsequently, the first interlayer insulating layers 415a to 415i and the second sacrificial layers 417a to 417h, which are exposed through the openings of the hard mask pattern 425, may be etched. Therefore, the slit trench SLT may be formed in the cell region, and second and third plug holes PH2 and PH3 may be simultaneously formed in the peripheral circuit region. An etching process for forming the slit trench SLT and the second and third plug holes PH2 and PH3 may be performed until the etch stop pattern 413a is exposed.

In an embodiment, a dry etching process may be performed to form the slit trench SLT and the second and third plug holes PH2 and PH3. For example, an anisotropic dry etching process may be performed. As a result, for example, side surfaces of the slit trench SLT and the second and third plug holes PH2 and PH3 may be perpendicular to the semiconductor substrate 400. The slit trench SLT and the second and third plug holes PH2 and PH3 may be formed by vertically penetrating the first interlayer insulating layers 415a to 415i and the second sacrificial layers 417a to 417h, and hence the first interlayer insulating layers 415a to 415i and the second sacrificial layers 417a to 417h may be exposed through the side surface of the slit trench SLT.

Referring to FIG. 5H, an etching process may be performed to remove the second sacrificial layers 417a to 417h exposed through the side surfaces of the slit trench SLT and the second and third plug holes PH2 and PH3. The etching process may also remove the etch stop pattern 413a exposed through bottom surfaces of the slit trench SLT and the second and third plug holes PH2 and PH3. Here, an isotropic etching process may be performed to remove the second sacrificial layers 417a to 417h included in the multilayer structure (414 of FIG. 5D). For example, an isotropic wet etching process may be performed here. As the second sacrificial layers 417a to 417h are removed, first recesses RC1 may be formed between the first interlayer insulating layers 415a to 415i.

Figure 5I:
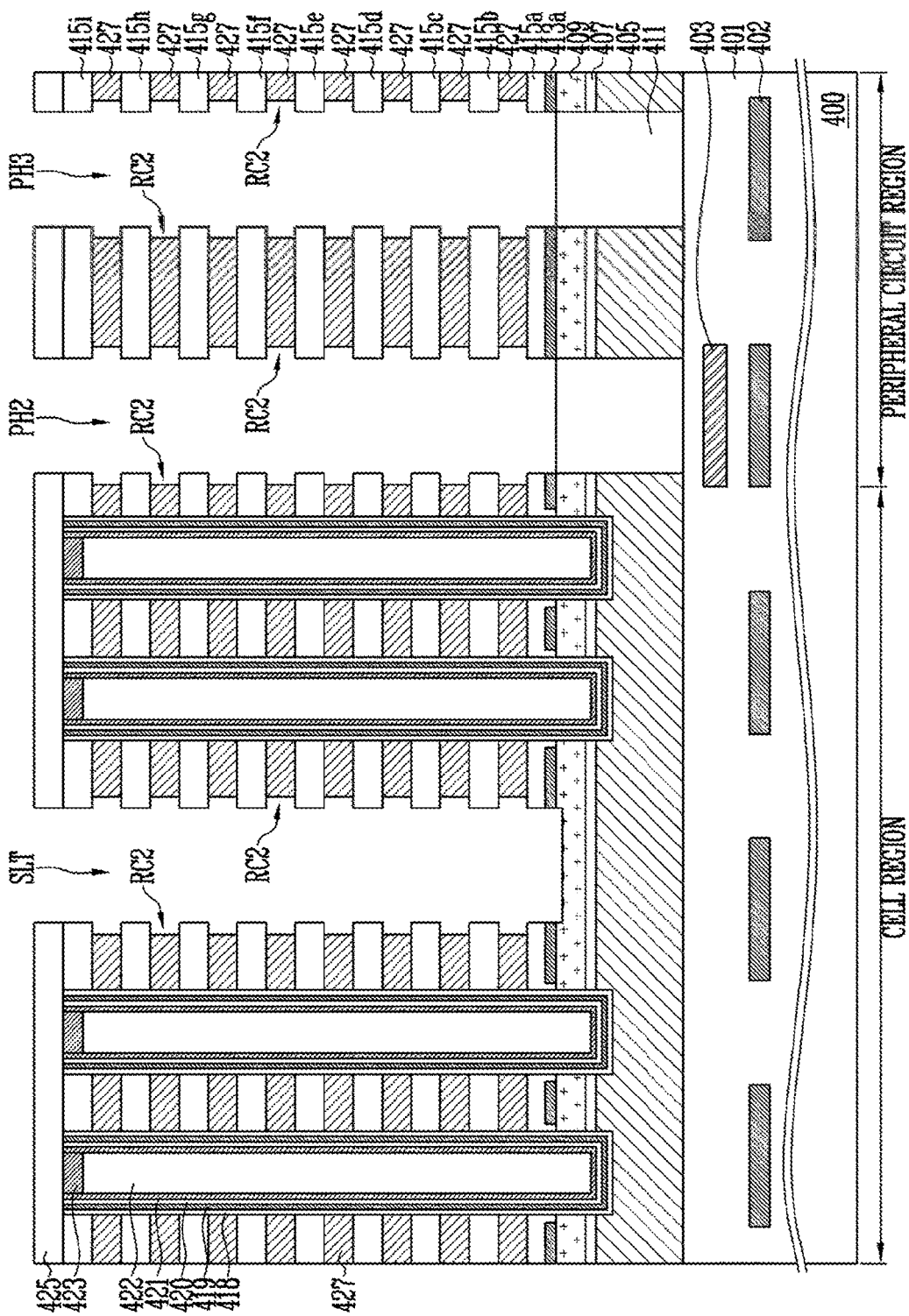

Referring to FIG. 5I, a second conductive layer 427 may be formed on the entire structure including the slit trench SLT and the second and third plug holes PH2 and PH3, so that the insides of the first recesses RC1 are filled with second conductive layer 427. The second conductive layer 427 may be a conductive layer for word lines, and may contain tungsten (W).

Subsequently, an etching process is performed to an extent that the second conductive layer 427 formed between the first interlayer insulating layers 415a to 415i remains and the second conductive layer 427 formed in the slit trench SLT and the second and third plug holes PH2 and PH3 is removed. In an embodiment, an anisotropic or isotropic etching process may be performed to remove the second conductive layer 427 formed in the slit trench SLT and the second and third plug holes PH2 and PH3. For example, an anisotropic dry etching process or isotropic dry etching process may be performed here. The etching process may be performed such that portions of the second conductive layer 427, exposed through the side surfaces of the slit trench SLT and the second and third plug holes PH2 and PH3, are over-etched to form second recesses RC2 in the side surfaces of the slit trench SLT and the second and third plug holes PH2 and PH3. For example, the second recesses RC2 may be formed between the first interlayer insulating layers 415a to 415i exposed through the side surfaces of the slit trench SLT and the second and third plug holes PH2 and PH3.

Referring to FIG. 5J, a spacer layer 429 may be formed on the entire structure such that the second recesses RC2 are filled with the spacer layer 429. The spacer layer 429 may be formed of a material having a different etch rate from the first sacrificial layer 409. For example, the spacer layer 429 may be formed of a nitride material or an $Al_2O_3$ material. Alternatively, the spacer layer 429 may be formed by stacking the nitride layer and the $Al_2O_3$ layer on top of one another.

Figure 5K:
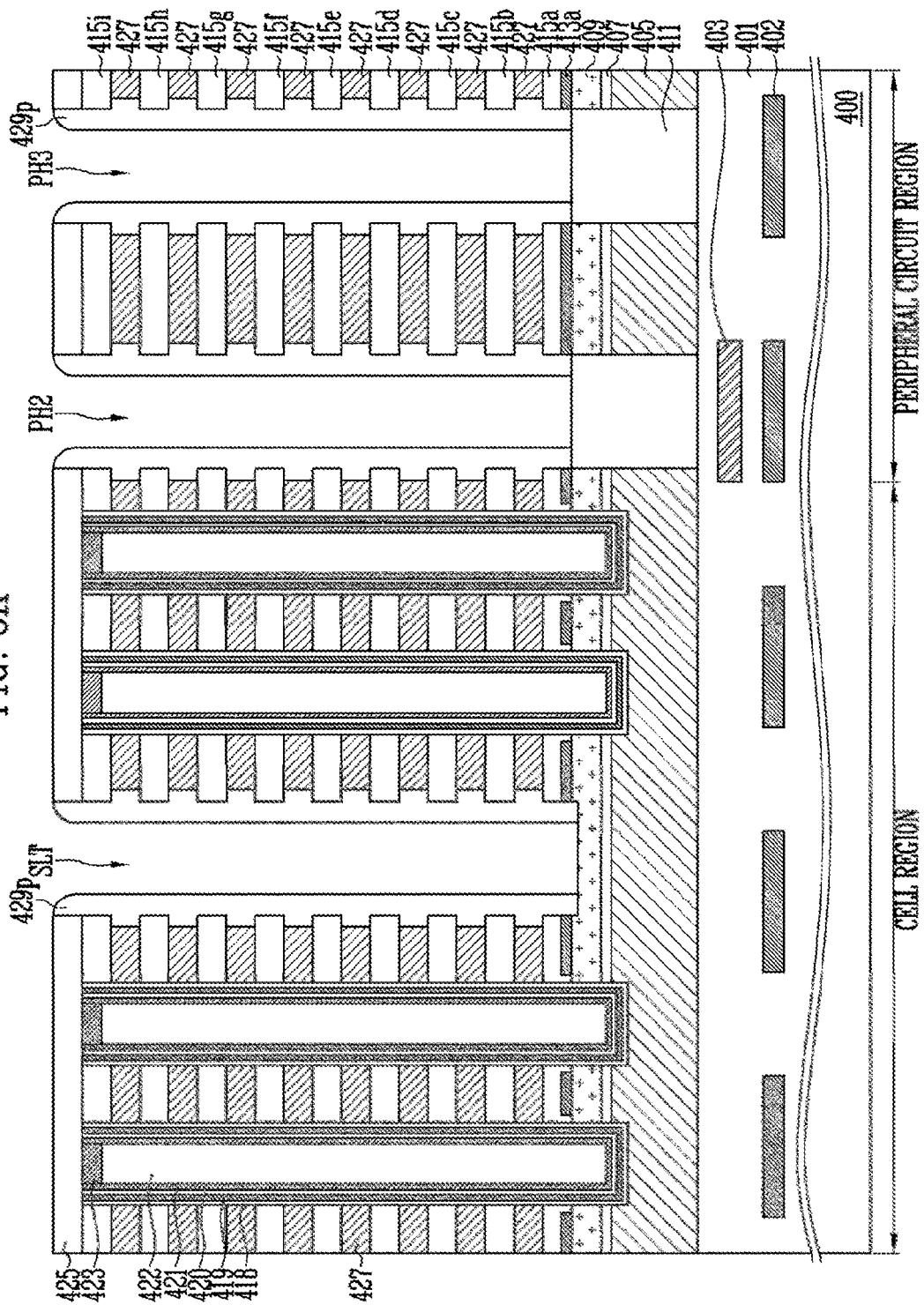

Referring to FIG. 5K, an etching process is performed to expose the first sacrificial layer 409 through the bottom surfaces of the slit trench SLT and the second and third plug holes PH2 and PH3. Here, a dry etching process such as an anisotropic dry etching process may be performed. If the anisotropic dry etching process is performed, the spacer layer 429 formed over the hard mask pattern 425 and the spacer layer 429 formed on the bottom surfaces of the slit trench SLT and the second and third plug holes PH2 and PH3 are removed, and portions of the spacer layer 429 may remain on the side surfaces of the slit trench SLT and the second and third plug holes PH2 and PH3. The remaining spacer layer 429 may become a spacer pattern 429p. The spacer pattern 429p can protect the second conductive layer 427 for word lines or select lines in a subsequent process.

Figure 5L:
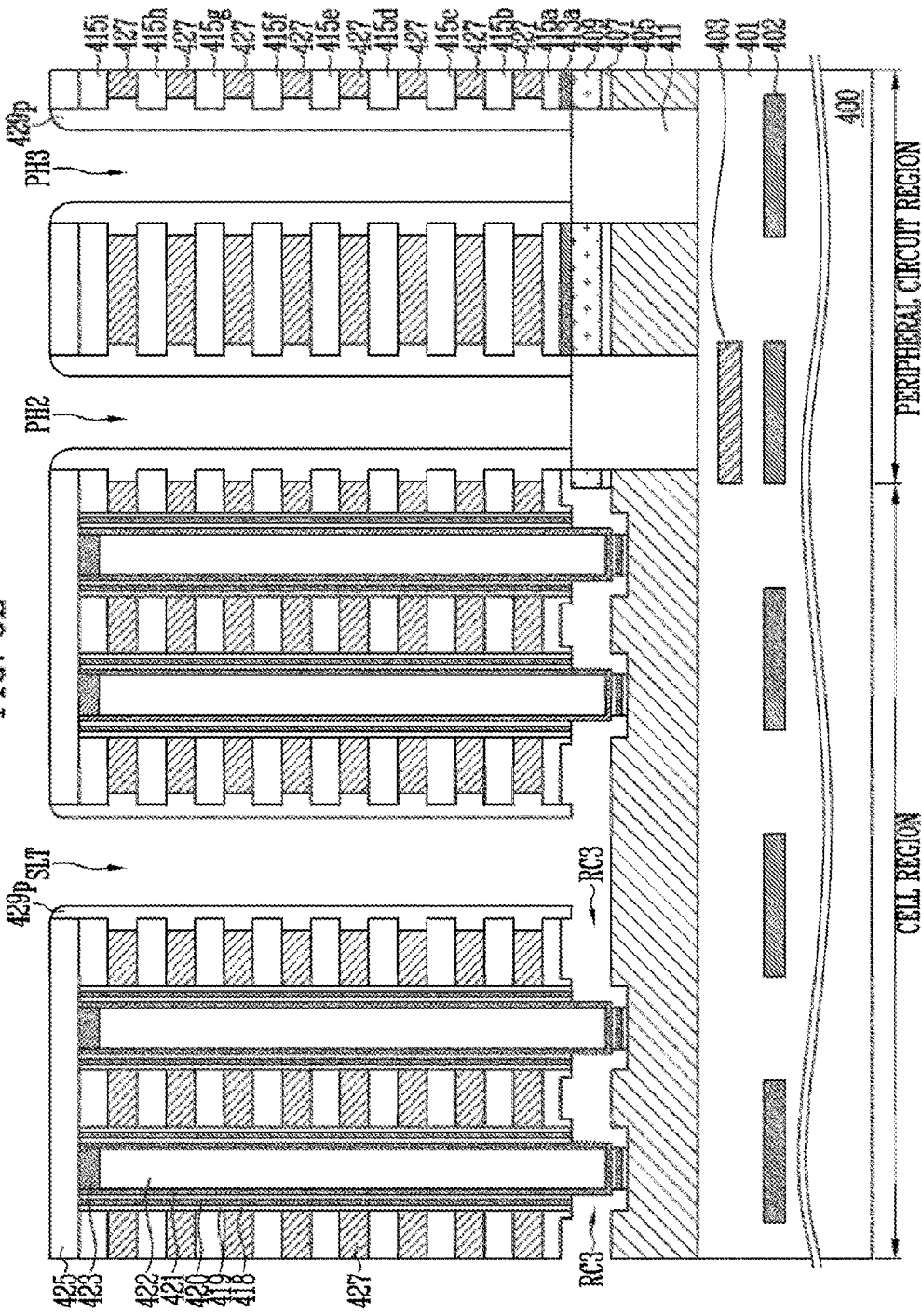
Figure 50:
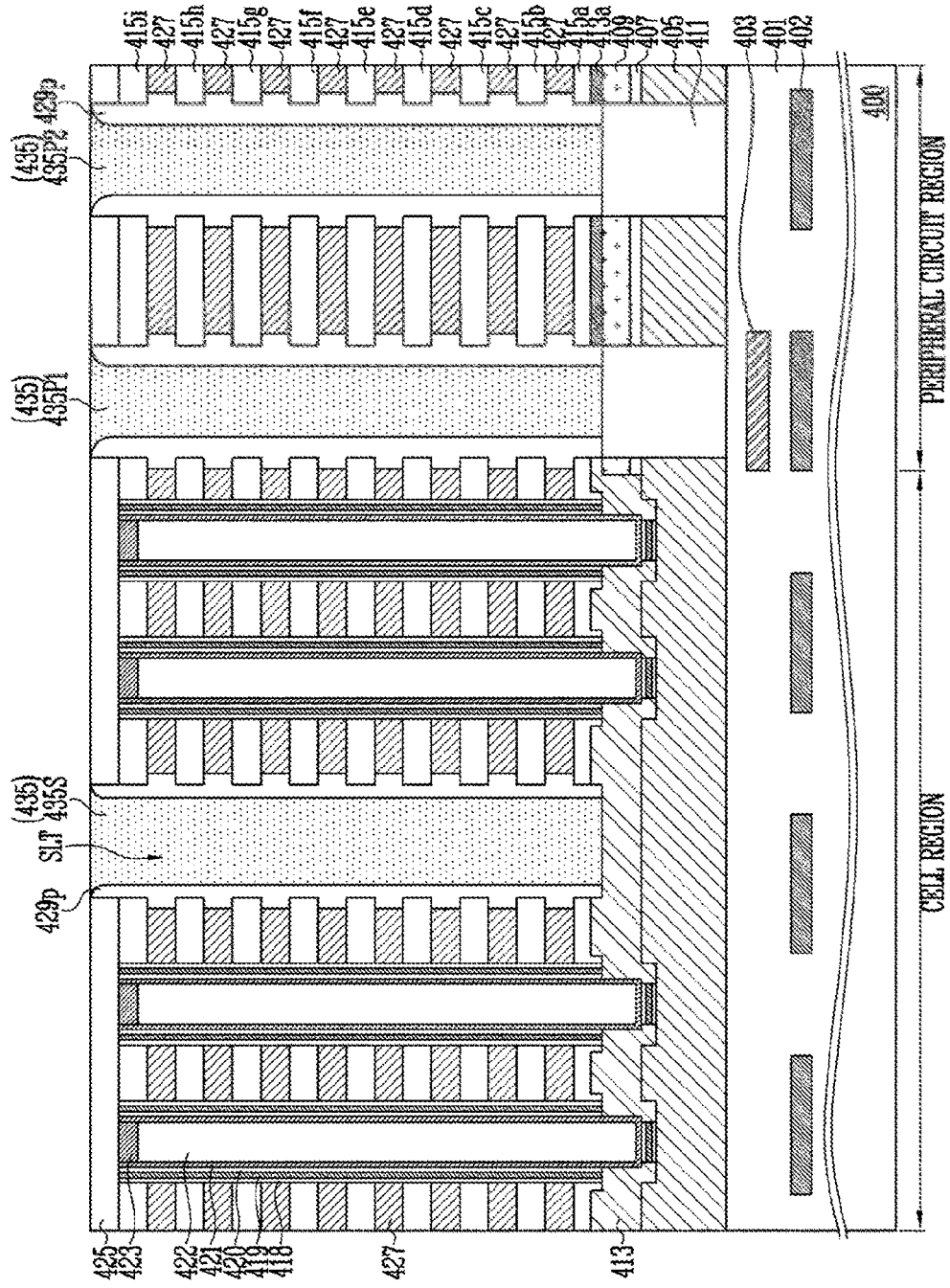

Referring to FIG. 5L, an etching process may be performed to remove the first sacrificial layer 409 exposed through the bottom surface of the slit trench SLT of the cell region. Here, an isotropic etching process such as a wet etching process may be performed. The wet etching process may be performed using an etchant having different etch rates with respect to different materials such as the first sacrificial layer 409, the spacer pattern 429p, and the channel layer 421. For example, the wet etching process may be performed using an etchant having a high etching selection ratio with respect to the first sacrificial layer 409 and a low etching selection ratio with respect to the spacer pattern 429p and the channel layer 421. When the first sacrificial layer 409 is removed through the wet etching process, an etching process may be performed such that portions of the memory layers formed at lower portions of the first to fourth vertical holes VH1 to VH4 remain. The memory layers remaining at the lower portions of the first to fourth vertical holes VH1 to VH4 are isolated from those formed at upper portions of the first to fourth vertical holes VH1 to VH4. Therefore, the memory layers remaining at the lower portions of the first to fourth vertical holes VH1 to VH4 may be used as layers that support the multilayer structure (414 of FIG. 5D) so that it is not inclined, rather than being used as memory layers. When the etching process for removing the first sacrificial layer 409 is performed, the spacer pattern 429p is partially removed, and therefore, the thickness of the spacer pattern 429p may decrease. In addition, as the first sacrificial layer 409 is removed, the second etch stop layer 407 of the cell region may be exposed. In this case, as the portions of the memory layers are removed, the second etch stop layer 407 may be removed together with the portions of the memory layers. That is, the second etch stop layer 407 may be used as an etch stop layer for preventing the first conductive layer 405 from being over-etched. As the first sacrificial layer 409 is removed, a third recess RC3 is formed between the multilayer structure 414 and the first conductive layer 405 in the cell region. That is, a portion of the channel layer 421 and the first conductive layer 405 may be exposed through the third recess RC3.

Referring to FIG. 5M, the portion of the channel layer 421 and the first conductive layer 405 are exposed through the third recess RC3 in the cell region. Since the channel layer 421 and the first conductive layer 405 are formed of the same material, a material layer formed of the same material as the channel layer 421 and the first conductive layer 405 may be selectively grown. For example, a third conductive layer 413 may be formed along surfaces of the channel layer 421 and the first conductive layer 405. Since both the channel layer 421 and the first conductive layer 405 are formed of polysilicon, the third conductive layer 431 may also be formed of polysilicon. Along the surface of the first conductive layer 405, the third conductive layer 431 may be formed of polysilicon by using a selective growth process, and as a result the third recess RC3 may be filled with the third conductive layer 431. Due to the third conductive layer 431, the first conductive layer 405, the channel layer 421, and the third conductive layer 431 may be electrically connected to each other.

Referring to FIG. 5N, in order to expose the first etch stop layer 403 and a portion of the interconnect lines 402 in the peripheral circuit region, a mask pattern 433 may be formed on the entire structure, and an etching process may be performed using the mask pattern 433 as an etching mask. The mask pattern 433 may include fourth and fifth plug holes PH4 and PH5 in the peripheral circuit region. The fourth plug hole PH4 may be formed in the second plug hole (PH2 of FIG. 5M), and the fifth plug hole PH5 may be formed in the third plug hole (PH3 of FIG. 5M). The width of the fourth and fifth plug holes PH4 and PH5 may be equal to or narrower than that of the second and third plug holes PH2 and PH3. However, the width of the fourth and fifth plug holes PH4 and PH5 may be narrower than that of the second and third plug holes PH2 and PH3.

In order to expose the first etch stop layer 403 and a portion of the interconnect lines 402 in the peripheral circuit region, a dry etching process may be performed. For example, an anisotropic dry etching process the etching process may be performed. The etching process may be performed such that the first etch stop layer 403 and a portion of the interconnect lines 402 are exposed in the peripheral circuit region by removing portions of the second insulating layer 411 and the first conductive layer 401 exposed through the fourth and fifth plug holes PH4 and PH5. If the etch stop pattern 403 is exposed while the etching process is being performed to expose the interconnect lines 402 through the fifth plug hole PH5, the etching process is not performed any more in the fourth plug hole PH4. As described above, a plurality of plug holes can be simultaneously exposed in different regions, using the etch stop pattern 403.

Referring to FIG. 5O, the mask pattern 433 may be removed, and a fourth conductive layer 435 is formed in the slit trench SLT and the fourth and fifth plug holes PH4 and PH5. For example, the fourth conductive layer 435 may be formed of tungsten. A fourth conductive layer 435S formed in the slit trench SLT of the cell region may become a plug for a source electrode connected to the third conductive layer 431. Fourth conductive layers 435P1 and 435P2 formed in the peripheral circuit region may become plugs selectively connected to the interconnect lines 402. For example, the fourth conductive layer 435P1 formed in the fourth plug hole PH4 is not connected to the interconnect line 402 because of the etch stop pattern 403, and the fourth conductive layer 435P2 formed in the fifth plug hole PH5 may be connected to the interconnect line 402.

As described above, the plug for the source electrode in the cell region and the plugs in the peripheral circuit region are simultaneously formed, thereby reducing the number of manufacturing steps of the memory device. Accordingly, it is possible to reduce the time required to perform a manufacturing process of the memory device.

Figure 6:
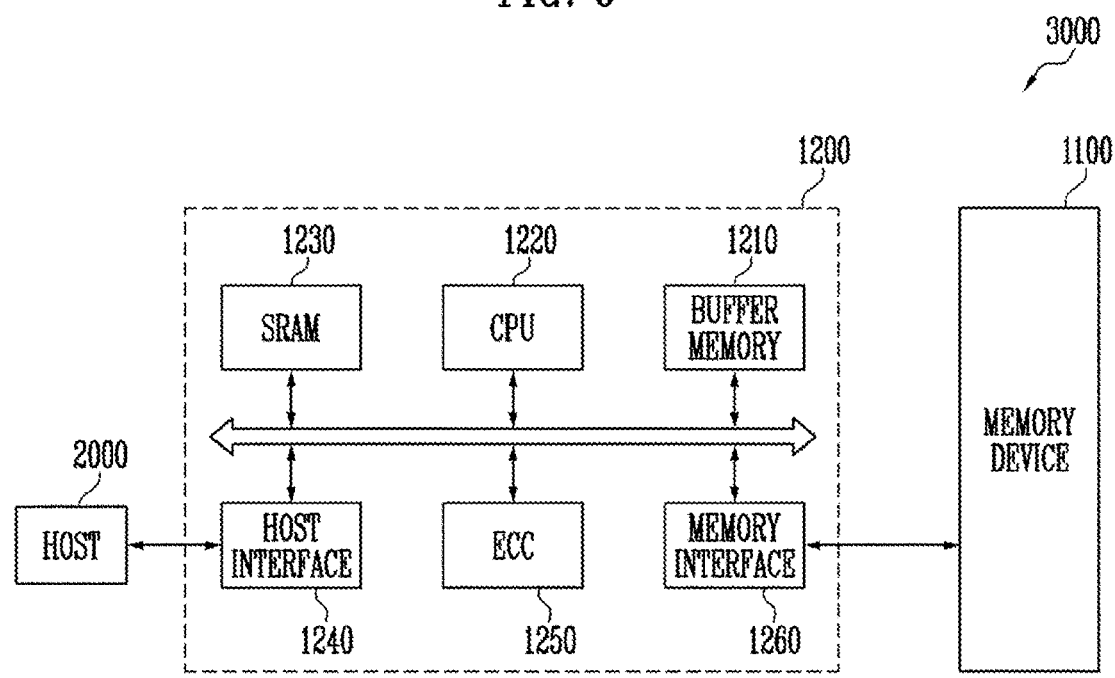
FIG. 6 is a diagram illustrating an example of a memory system according to an embodiment of the present disclosure.

FIG. 6 is a diagram illustrating an example of a memory system according to an embodiment of the present disclosure.

Referring to FIG. 6, the memory system 3000 may include a memory device 1100 for storing data and a memory controller 1200 for controlling the memory device 1100. Also, the memory controller 1200 may control communication between a host 2000 and the memory device 1100. The memory controller 1200 may include a buffer memory 1210, a CPU 1220, an SRAM 1230, a host interface 1240, an ECC 1250, and a memory interface 1260.

The buffer memory 1210 may temporarily store data while the memory controller 1200 is controlling operations of the memory device 1100. The CPU 1220 may perform a control operation for data exchange of the memory controller 1200. The SRAM 1230 may be used as a working memory of the CPU 1220. The host interface 1240 may be provided with a data exchange protocol of the host 2000 connected to the memory system 3000. The ECC 1250 is an error correction unit, and may detect and correct errors included in data read out from the memory device 1100. The semiconductor interface 1260 may interface with the memory device 1100. Although not illustrated in FIG. 6, the memory system 3000 may further include a ROM for storing code data for interfacing with the host 2000.

The host 2000 requesting read/write operations to the memory system 3000 may include a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 7:
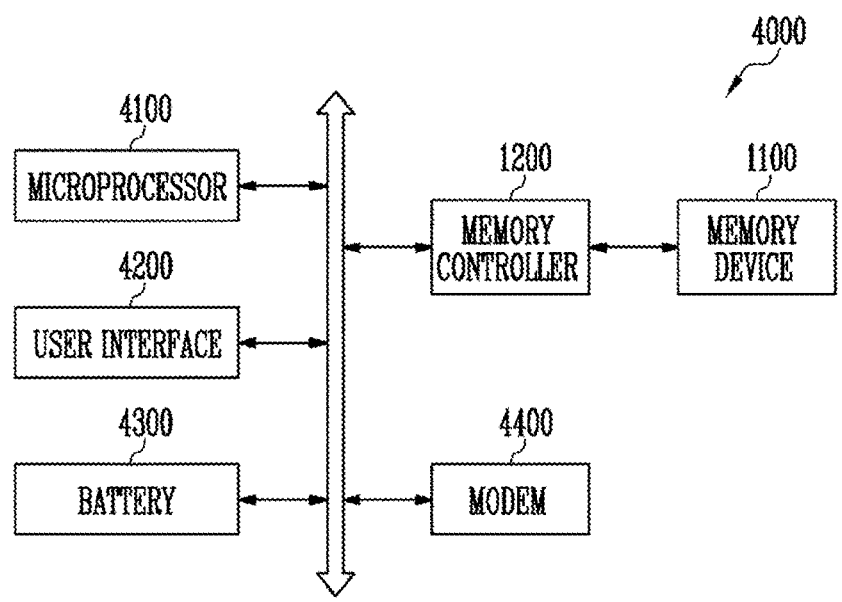
FIG. 7 is a diagram illustrating an example configuration of a computing system including a memory system according to an embodiment of the present disclosure.

FIG. 7 is a diagram illustrating an example configuration of a computing system including a memory system according to an embodiment of the present disclosure.

Referring to FIG. 7, the computing system 4000 may include a memory device 1110, a memory controller 1200, a microprocessor 4100, a user interface 4200, and a modem 4400, which are electrically connected to a bus. When the computing system 4000 is a mobile device, a battery 4300 for supplying operating voltages of the computing system 4000 may be additionally provided in the computing system 4000. Although not illustrated, the computing system 4000 may further include an application chip set, a camera image processor (CIS), a mobile DRAM, and the like. The memory controller 1200 and the memory device 1110 may constitute a solid state drive/disk (SSD).

The computing system 4000 may be packaged in various forms. For example, the computing system 4000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

According to an embodiment of the present disclosure, manufacturing steps of the memory device may be simplified, thereby reducing the time required to perform a manufacturing process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a memory device, the method comprising:
   providing a semiconductor substrate including a first region and a second region;
   forming a lower structure including interconnect lines and an etch stop layer in the second region;
   forming a conductive layer on the lower structure;
   forming a multilayer structure including memory cells on the conductive layer; and
   forming a slit trench exposing the conductive layer in the multilayer structure of the first region, a first plug hole exposing the etch stop layer of the second region therethrough, and a second plug hole exposing a portion of the interconnect lines of the second region therethrough, wherein forming the slit trench and the first and second plug holes includes:
   forming, on the multilayer structure, a hard mask pattern including openings formed where the slit trench and the first and second plug holes are to be formed;
   etching a portion of the multilayer structure exposed through insides of the openings;
   forming, on the etched multilayer structure, a mask pattern including openings formed where the first and second plug holes are to be formed; and
   etching a portion of the lower structure exposed between the openings of the mask pattern, and forming the first and second plug holes.

2. The method of claim 1, wherein forming the lower structure includes:
   forming a peripheral circuit on the semiconductor substrate; and
   forming the interconnect lines and the etch stop layer on the peripheral circuit.

3. The method of claim 1, wherein the multilayer structure is formed by alternately stacking insulating layers and sacrificial layers on the lower structure.

4. The method of claim 1, wherein the etch stop layer is formed of a polysilicon material.

5. The method of claim 1, wherein etching the portion of the multilayer structure and the portion of the lower structure is performed through an anisotropic dry etching process.

6. The method of claim 5, wherein the first plug hole is formed by etching a portion of the lower structure until the etch stop layer is exposed, and
   the second plug hole is formed by etching a portion of the lower structure until a portion of the interconnect line is exposed.

7. A method of manufacturing a memory device, the method comprising:
   forming a lower structure including interconnect lines and a first etch stop layer on a semiconductor substrate including a cell region and a peripheral circuit region;
   sequentially forming a first conductive layer, a second etch stop layer, and a second conductive layer on the lower structure;
   forming, in the peripheral circuit region, a first insulating layers vertically penetrating the second conductive layer, the second etch stop layer, and the first conductive layer;
   forming, in the cell region, an etch stop pattern including openings on the second conductive layer and the first insulating layers;

forming a multilayer structure on the entire structure including the etch stop pattern;

forming vertical holes vertically penetrating the multilayer structure of the cell region, and forming memory layers and channel layers inside the vertical holes;

forming a slit trench vertically penetrating the multilayer structure of the cell region and plug holes vertically penetrating the multilayer structure of the peripheral circuit region; and etching the lower structure exposed through bottom surfaces of the plug holes such that the first etch stop layer and a portion of the interconnect lines are exposed in the peripheral circuit region.

8. The method of claim 7, wherein forming the lower structure includes:

forming a second insulating layer on the semiconductor substrate;

forming the interconnect lines on the second insulating layer;

additionally forming the second insulating layer to cover the interconnect lines;

forming the first etch stop layer on the additionally formed second insulating layer; and additionally forming the second insulating layer on the first etch stop layer.

9. The method of claim 8, wherein the first etch stop layer is formed over a portion of the interconnect lines.

10. The method of claim 7, wherein the first etch stop layer is formed of a polysilicon material.

11. The method of claim 7, wherein the first insulating layers are formed over the interconnect lines and the first etch stop layer formed in the peripheral circuit region.

12. The method of claim 7, wherein the first insulating layers are formed of an oxide material.

13. The method of claim 7, wherein the etch stop pattern is formed of an $Al_2O_3$ material.

14. The method of claim 7, wherein the openings included in the etch stop pattern are formed where the vertical holes are to be formed.

15. The method of claim 7, wherein forming the multilayer structure includes alternately forming interlayer insulating layers and sacrificial layers on the entire structure including the etch stop pattern.

16. The method of claim 7, wherein forming the slit trench and the plug holes is performed through an etching process such that the slit trench vertically penetrates the multilayer structure between the vertical holes, and such that the plug holes vertically penetrate the multilayer structure formed over the first insulating layers.

17. The method of claim 7, wherein, in forming the slit trench and the plug holes, a portion of the multilayer structure is vertically etched until a portion of the etch stop pattern is exposed.

18. The method of claim 17, wherein, when the lower structure exposed through the bottom surfaces of the plug holes is etched, the etch stop pattern exposed in the peripheral circuit region is removed, and the first etch stop layer and the portion of the interconnect lines are exposed by etching the portion of the lower structure.

19. The method of claim 7, further comprising:

between forming the plug holes and exposing the first etch stop layer and the portion of the interconnect lines, removing the sacrificial layers exposed through the slit trench and the plug holes, and forming recesses between the interlayer insulating layers; and forming a third conductive layer inside the recesses.

* * * * *